(12) United States Patent
Kua et al.

(10) Patent No.: US 11,195,976 B2
(45) Date of Patent: Dec. 7, 2021

(54) OPTOELECTRONIC COMPONENT

(71) Applicant: OSRAM Opto Semiconductors GmbH, Regensburg (DE)

(72) Inventors: Jia Ping Jackson Kua, Penang (MY); Tilman Eckert, Regensburg (DE); Alexander Linkov, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/604,573

(22) PCT Filed: Mar. 29, 2018

(86) PCT No.: PCT/EP2018/058247
§ 371 (c)(1),
(2) Date: Oct. 11, 2019

(87) PCT Pub. No.: WO2018/188976
PCT Pub. Date: Oct. 18, 2018

(65) Prior Publication Data
US 2020/0098948 A1 Mar. 26, 2020

(30) Foreign Application Priority Data
Apr. 12, 2017 (DE) ...................... 10 2017 107 957.2

(51) Int. Cl.
H01L 33/44 (2010.01)
H01L 33/42 (2010.01)
(Continued)

(52) U.S. Cl.
CPC ............. H01L 33/44 (2013.01); H01L 33/42 (2013.01); H01L 33/46 (2013.01); H01L 33/56 (2013.01); H01L 33/60 (2013.01); H01L 33/62 (2013.01)

(58) Field of Classification Search
CPC ......... H01L 33/44; H01L 33/46; H01L 33/42; H01L 33/56; H01L 33/60; H01L 33/62
(Continued)

(56) References Cited

U.S. PATENT DOCUMENTS

| 6,774,401 B2 | 8/2004 | Nakada et al. | |
| 2004/0264192 A1* | 12/2004 | Nagata | H04N 9/3144 362/267 |

(Continued)

FOREIGN PATENT DOCUMENTS

| CN | 101621106 A | 1/2010 |
| EP | 2423989 A2 | 2/2012 |

(Continued)

OTHER PUBLICATIONS

Search Report for the corresponding German Patent Application No. 10 2017 107 957.2 (10 pages) dated Mar. 21, 2018 (for reference purpose only).

(Continued)

Primary Examiner — David Vu
Assistant Examiner — Brandon C Fox
(74) Attorney, Agent, or Firm — Viering, Jentschura & Partner MBB

(57) ABSTRACT

An optoelectronic component may have a semiconductor chip designed to emit electromagnetic radiation. The semiconductor chip may have a radiation exit surface, and a protective layer arranged over the radiation exit surface. The protective layer may include at least one first layer comprising an aluminum oxide and at least one second layer comprising a silicon oxide a silicon oxide, and at least one third layer comprising a titanium oxide. A current spreading layer may include one or more transparent conductive oxides arranged between the radiation exit surface and the protective layer.

20 Claims, 3 Drawing Sheets

(51) Int. Cl.
*H01L 33/56* (2010.01)
*H01L 33/60* (2010.01)
*H01L 33/62* (2010.01)
*H01L 33/46* (2010.01)

(58) Field of Classification Search
USPC .......................................................... 257/98
See application file for complete search history.

(56) References Cited

U.S. PATENT DOCUMENTS

| | | | |
|---|---|---|---|
| 2008/0224157 A1* | 9/2008 | Slater | H01L 33/44 257/98 |
| 2013/0210178 A1 | 8/2013 | Li et al. | |
| 2015/0228870 A1* | 8/2015 | Goeoetz | H01L 33/50 257/98 |
| 2016/0087159 A1* | 3/2016 | Kim | H01L 33/46 257/98 |
| 2018/0076362 A1* | 3/2018 | Jeon | H01L 33/24 |

FOREIGN PATENT DOCUMENTS

| | | | |
|---|---|---|---|
| WO | 2015044529 A1 | 4/2015 | |
| WO | 2015161961 A1 | 10/2015 | |
| WO | WO-2015161961 A1 * | 10/2015 | ............. H01L 33/42 |

OTHER PUBLICATIONS

International Search Report for the corresponding PCT Application No. PCT/EP2018/058247 (3 pages) dated Jun. 8, 2018 (for reference purpose only).

\* cited by examiner

OPTOELECTRONIC COMPONENT

CROSS-REFERENCE TO RELATED APPLICATIONS

The present application is a national stage entry according to 35 U.S.C. § 371 of PCT application No.: PCT/EP2018/058247 filed on Mar. 29, 2018; which claims priority to German patent application 10 2017 107 957.2 filed on Apr. 12, 2017; both of which are incorporated herein by reference in their entirety and for all purposes.

TECHNICAL FIELD

The present invention relates to an optoelectronic component.

BACKGROUND

Semiconductor chips are used in optoelectronic components, for example light-emitting diodes (LEDs) must be protected against moisture. To this end, a barrier layer of $SiO_2$ is frequently arranged over the semiconductor chip and the package. In addition, the semiconductor chips are frequently encapsulated with a silicone. However, the combination of a barrier layer of $SiO_2$ with silicone encapsulation leads to a poor luminous efficiency because of the difference of the refractive indices of the layers of the semiconductor chip, of $SiO_2$ and of silicone.

SUMMARY

It is therefore an object of at least one non-limiting embodiment to provide an optoelectronic component which has a good luminous efficiency that is improved compared with the prior art.

An optoelectronic component, in particular a light-emitting diode (LED), is provided. The optoelectronic component comprises a semiconductor chip, which is adapted to emit electromagnetic radiation. The semiconductor chip comprises a radiation exit surface, over which a protective layer is arranged.

According to at least one embodiment, the protective layer comprises at least one first layer comprising an aluminum oxide and at least one second layer comprising a silicon oxide. The protective layer may also consist of the first layer and the second layer. The refractive index of the protective layer according to this embodiment is, such as between 1.55 and 1.75.

According to at least one embodiment, the protective layer comprises at least one first layer comprising an aluminum oxide and at least one third layer comprising a titanium oxide. The protective layer may also consist of the first layer and the third layer. The refractive index of the protective layer according to this embodiment is, such as 1.8 and 2.4.

According to at least one embodiment, the protective layer comprises at least one second layer comprising a silicon oxide and at least one third layer comprising a titanium oxide. The protective layer may also consist of the third layer and the second layer. The refractive index of the protective layer according to this embodiment is, such as between 1.55 and 2.4.

Here and in what follows, that a layer or an element is arranged or applied "on" or "over" another layer or another element may mean that the one layer or the one element is arranged immediately in direct mechanical and/or electrical contact on the other layer or the other element. Furthermore, it may also mean that the one layer or the one element is arranged indirectly on or over the other layer or the other element. In this case, further layers and/or elements may then be arranged between the one layer or the other, or between the one element and the other.

According to at least one embodiment, the protective layer comprises at least two first layers comprising an aluminum oxide and at least two second layers comprising a silicon oxide. The first and the second layers are in this case, such as arranged alternatingly. An alternating arrangement in this case means that a second layer is arranged over a first layer and a first layer is in turn arranged over the second layer, or that a first layer is arranged over a second layer and a second layer is in turn arranged over the first layer. The protective layer may also consist of the first layers and the second layers. The refractive index of the protective layer according to this embodiment is, such as between 1.55 and 1.75.

According to at least one embodiment, the protective layer comprises at least two first layers comprising an aluminum oxide and at least two third layers comprising a titanium oxide. The first and the third layers are in this case, such as arranged alternatingly. The refractive index of the protective layer according to this embodiment is, such as between 1.8 and 2.4.

According to at least one embodiment, the protective layer comprises at least two second layers comprising a silicon oxide and at least two third layers comprising a titanium oxide. The second and the third layers are in this case, such as arranged alternatingly. The refractive index of the protective layer according to this embodiment is, such as between 1.55 and 2.4.

According to at least one embodiment, the second layer comprises $SiO_2$ or consists of $SiO_2$.

According to at least one embodiment, the first layer comprises $Al_2O_3$ or consists of $Al_2O_3$.

According to at least one embodiment, the third layer comprises $TiO_2$ or consists of $TiO_2$.

According to at least one embodiment, the semiconductor chip comprises a layer sequence.

A "layer sequence" is in this context to be understood as a layer sequence comprising more than one layer, for example a sequence of a p-doped and an n-doped semiconductor layer, the layers being arranged over one another and at least one active layer that emits electromagnetic radiation being contained.

According to at least one embodiment, the semiconductor chip comprises an epitaxial layer sequence, such as an epitaxially grown semiconductor layer sequence.

In this case, the layer sequence may, for example, be embodied on the basis of InGaAlN. InGaAlN-based semiconductor chips and semiconductor layer sequences are, in particular, ones in which the epitaxially produced semiconductor layer sequence comprises a layer sequence of different individual layers, which contains at least one individual layer that comprises a material from the III-V compound semiconductor material system $In_xAl_yGa_{1-x-y}N$ with $0 \leq x \leq 1$, $0 \leq y \leq 1$ and $x+y \leq 1$. Semiconductor layer sequences which comprise at least one active layer based on InGaAlN may, for example, emit electromagnetic radiation in an ultraviolet to green wavelength range.

Furthermore, the semiconductor layer sequence may, for example, be embodied on the basis of AlGaAs. AlGaAs-based semiconductor chips and semiconductor layer sequences are, in particular, ones in which the epitaxially produced semiconductor layer sequence generally comprises a layer sequence of different individual layers, which contains at least one individual layer that comprises a material from the III-V compound semiconductor material system $Al_xGa_{1-x}As$ with $0 \leq x \leq 1$. In particular, an active layer which comprises a material based on AlGaAs may be suitable for emitting electromagnetic radiation with one or more spectral components in a red to infrared wavelength range. Furthermore, such a material may comprise In and/or P in addition or as an alternative to the elements mentioned.

Furthermore, the layer sequence may, for example, be embodied on the basis of InGaAlP. InGaAlP-based semiconductor chips and semiconductor layer sequences are, in particular, ones in which the epitaxially produced semiconductor layer sequence comprises a layer sequence of different individual layers, which contains at least one individual layer that comprises a material from the III-V compound semiconductor material system $In_xAl_yGa_{1-x-y}P$ with $0 \square x \square 1$, $0 \square y \square 1$ and $x+y \square 1$. Semiconductor layer sequences which comprise at least one active layer based on InGaAlN may, for example, emit electromagnetic radiation in a red wavelength range.

Besides the active layer, the active semiconductor layer sequence may comprise further functional layers and functional regions, for instance p- or n-doped charge carrier transport layers, i.e. electron or hole transport layers, undoped or p- or n-doped confinement, cladding or waveguide layers, barrier layers, planarization layers, buffer layers, protective layers and/or electrodes as well as combinations thereof. Furthermore, for example, one or more mirror layers may be applied on a side, facing away from the growth substrate, of the semiconductor layer sequence. The structures described here relating to the active layer or the further functional layers and regions are known to the person skilled in the art particularly in respect of construction, function and structure, and will therefore not be explained in detail at this point.

Here and in what follows, a radiation exit surface of the semiconductor chip refers to a main surface of the semiconductor chip, or of the layer sequence. The radiation exit surface extends in particular parallel to a main extent plane of the semiconductor layers of the layer sequence, and for example at least 85% or 90% of the radiation leaving the layer sequence exits from the layer sequence through the radiation exit surface.

The protective layer has a refractive index $n_D^\alpha$ of between 1.55 and 2.4, such as between 1.55 and 1.75, alternatively between 1.60 and 1.70, for example about 1.7. The refractive index $n_D^\alpha$ of $SiO_2$ is 1.46, the refractive index $n_D^\alpha$ of $Al_2O_3$ is 1.77 and the refractive index $n_D^\alpha$ of $TiO_2$ is more than 2.45, depending on the modification. The layer sequence of the semiconductor chip, based for example on $In_xAl_yGa_{1-x-y}N$, $Al_xGa_{1-x}As$ or $In_xAl_yGa_{1-x-y}P$, usually has a refractive index of more than 2, for example about 2.4. It has been found that the radiation emitted by the semiconductor chip can be output best through the radiation exit surface when the refractive index of the layers remains the same or decreases successively, i.e. stepwise, starting with the semiconductor layer sequence. In the case of a protective layer of $SiO_2$ as known from the prior art, with a refractive index $n_D^\alpha$ of 1.46, the refractive index jump is high, so that a loss of radiation externally output is to be observed. With the protective layer, which has a refractive index $n_D^\alpha$ of from 1.55 to 2.4, for example about 1.7, through the selection of the composition of the protective layer consisting of the first, second and/or third layers, the refractive index jump may be reduced significantly and the luminous efficiency may therefore be increased. In addition, by the protective layer, the semiconductor chip is furthermore protected sufficiently against ingress of moisture and/or oxygen, which penetrates through the protective layer scarcely or not at all. With the protective layer, on the one hand the luminous efficiency and on the other hand the lifetime of the optoelectronic component may therefore be increased.

According to at least one embodiment, the protective layer comprises at least two first layers comprising an aluminum oxide and at least two second layers comprising a silicon oxide. In a non-limiting embodiment, the protective layer is arranged according to this embodiment in such a way that the second layers are respectively arranged over the first layers. In other words, the protective layer is arranged in such a way that the first layer is arranged before the respective second layer in the beam path of the radiation of the semiconductor chip. If the protective layer comprises two first layers and two second layers, for example, a first layer, a second layer, a first layer and a second layer may be arranged over the radiation exit surface in the order mentioned. In this case, in particular, the first layers may have a layer thickness of 40 nm and the second layers may have a layer thickness of 20 nm. The refractive index of the protective layer according to this embodiment is, such as between 1.55 and 1.7. This arrangement has surprisingly been found to be particularly advantageous in terms of improving the luminous efficiency.

According to at least one embodiment, the protective layer comprises at least two first layers comprising an aluminum oxide and at least two third layers comprising a titanium oxide. The refractive index of the protective layer according to this embodiment is, such as between 1.8 and 2.4.

According to at least one embodiment, the protective layer comprises at least two second layers comprising a silicon oxide and at least two third layers comprising a titanium oxide. The refractive index of the protective layer according to this embodiment is, such as between 1.55 and 2.4.

According to at least one embodiment, the protective layer comprises at least one first layer comprising an aluminum oxide, at least one second layer comprising a silicon oxide and at least one third layer comprising a titanium oxide. The protective layer may also consist of the first layer, the second layer and the third layer. The refractive index of the protective layer according to this embodiment is, such as between 1.55 and 2.4.

According to at least one embodiment, the protective layer comprises at least two first layers comprising an aluminum oxide, at least two second layers comprising a silicon silicon oxide and at least two third layers comprising a titanium oxide. The protective layer may also consist of the first layers, the second layers and the third layers. The refractive index of the protective layer according to this embodiment is, such as between 1.55 and 2.4.

According to at least one embodiment, the protective layer is arranged in such a way that the third layers are respectively arranged over the second layers and the second layers are respectively arranged over the first layers. In other words, the protective layer is arranged in such a way that the respective first layer is arranged before the respective second layer and the respective second layer is arranged before the respective third layer in the beam path of the radiation of the semiconductor chip.

According to at least one embodiment, the first, the second and/or the third layers respectively have a layer thickness of between 20 nm inclusive and 120 nm inclusive. The first layer and/or the second layer and/or the third layer may respectively have the same or a different layer thickness. If the layers have a layer thickness of less than 20 nm they are on the one hand no longer thick enough to have a moisture- or oxygen-repellent effect, and on the other hand they then do not exhibit an optical effect in terms of improved light output. For example, the first layer respectively has a layer thickness of from 30 nm inclusive to 100 nm inclusive for example 40 nm, and the second layer respectively has a layer thickness of from 20 nm inclusive to 100 nm inclusive, for example 20 nm, and the third layer respectively has a layer thickness of from 20 nm inclusive to 100 nm inclusive. By means of the layer thicknesses, the refractive index of the protective layer may, in particular, be adapted in such a way that the refractive index of the layers decreases successively over the protective layer starting with the semiconductor layer sequence. By varying the layer thicknesses and composition of the protective layer, it is thus possible to optimize the refractive index, in order to ensure optimal output of the electromagnetic radiation.

According to at least one embodiment, the protective layer comprises between two inclusive and 50 inclusive first layers and between two inclusive and 50 inclusive second layers, or between two inclusive and 50 inclusive first layers, between two inclusive and 50 inclusive second layers and between two inclusive and 50 inclusive third layers. In a non-limiting embodiment, the protective layer comprises between two inclusive and 10 inclusive first layers and between two inclusive and 10 inclusive second layers, or between two inclusive and 10 inclusive first layers, between two inclusive and 10 inclusive second layers and between two inclusive and 10 inclusive third layers. In a non-limiting embodiment, the protective layer comprises between two inclusive and six inclusive first layers and between two inclusive and six inclusive second layers, or between two inclusive and six inclusive first layers, between two inclusive and six inclusive second layers and between two inclusive and six inclusive third layers.

According to at least one embodiment, the protective layer comprises between two inclusive and 50 inclusive first layers and between two inclusive and 50 inclusive third layers, or between two inclusive and 50 inclusive second layers and between two inclusive and 50 inclusive third layers. In a non-limiting embodiment, the protective layer comprises between two inclusive and 10 inclusive first layers and between two inclusive and 10 inclusive third layers, or between two inclusive and 10 inclusive third layers and between two inclusive and 10 inclusive second layers. In a non-limiting embodiment, the protective layer comprises between two inclusive and six inclusive first layers and between two inclusive and six inclusive third layers, or between two inclusive and six inclusive third layers and between two inclusive and six inclusive second layers.

According to at least one embodiment, the protective layer is arranged over the side surfaces of the semiconductor chip. In particular, this embodiment is advantageous when the radiation is also emitted through the side surfaces of the semiconductor chip.

According to at least one embodiment, the semiconductor chip comprises a substrate, in particular a substrate made of sapphire. In particular, the semiconductor layer sequence is arranged over the substrate. The substrate may be arranged on the main surface, lying opposite the radiation exit surface, of the layer sequence, so that the protective layer and the substrate lie on opposite main surfaces of the layer sequence.

According to at least one embodiment, a current spreading layer is arranged between the radiation exit surface and the protective layer. The current spreading layer may include one or more transparent conductive oxides or consists of one or more such oxides. The current spreading layer may in this case additionally comprise doping. In particular, the current spreading layer, or the transparent conductive oxide of the current spreading layer, has a refractive index $n_D^\alpha$ of between 2.0 and 1.8. According to this non-limiting embodiment of the component, the protective layer has, in particular, a refractive index of between 1.55 and 1.7. In a non-limiting embodiment, the protective layer comprises one or more first layers comprising an aluminum oxide and one or more second layer comprising a silicon oxide, or one or more third layers comprising a titanium oxide and one or more second layers comprising a silicon oxide, or consists of these layers. The refractive index of the current spreading layer therefore lies between the refractive index of about 2.4 of the semiconductor layer sequence and the refractive index of about 1.55 to 1.75 of the protective layer. This stepwise reduction of the refractive index of the layers through which the radiation passes leads to less light losses, so that the luminous efficiency is improved.

Here and in what follows, that a layer or an element is arranged "between" two other layers or elements may mean that the one layer or the one element is arranged immediately in direct mechanical and/or electrical contact or in indirect contact with one of the two other layers or elements and in direct mechanical and/or electrical contact or in indirect contact with the other of the two other layers or elements. In this case, with indirect contact, further layers and/or elements may then be arranged between the one and at least one of the two other layers, or between the one and at least one of the two other elements.

According to at least one embodiment, the refractive index of the layers which are arranged over the semiconductor chip decreases stepwise. By the in particular stepwise reduction of the refractive index of the layers through which the radiation passes, the luminous efficiency is improved.

According to at least one embodiment, the refractive index $n_D^\alpha$ of the protective layer is between 0.1 and 0.3 less than the refractive index $n_D^\alpha$ of the current spreading layer. This reduction of the refractive index has been found to be particularly advantageous in terms of the luminous efficiency.

In one non-limiting embodiment, the current spreading layer comprises indium tin oxide or consists of indium tin oxide. Indium tin oxide has a refractive index $n_D^\alpha$ of 1.9. The refractive index of the indium tin oxide of the current spreading layer therefore lies between the refractive index of about 2.4 of the semiconductor layer sequence and the refractive index of about 1.55 to 1.75 of the protective layer. A successive reduction of the refractive index from about 2.4 through about 1.9 to about 1.55 to 1.75, perpendicularly to the main extent plane of the semiconductor layer sequence, may thus advantageously be ensured, and the luminous efficiency and the light output may thus be improved.

According to at least one embodiment, the current spreading layer is arranged directly on the semiconductor chip, in particular on the radiation exit surface of the semiconductor chip, and is in direct mechanical contact with the latter. In a non-limiting embodiment, the radiation exit surface is covered fully, or surface-wide, with the current spreading layer.

According to at least one embodiment, the protective layer is arranged directly on the current spreading layer and is in direct mechanical contact therewith. In particular, in this embodiment the current spreading layer is arranged directly on the semiconductor chip, in particular on the radiation exit surface of the semiconductor chip, and is in direct mechanical contact with the latter.

According to at least one embodiment, an encapsulation is arranged over the protective layer. In particular, the material of the encapsulation has a refractive index $n_D^\alpha$ of between 1.4 and 2.4, such as between 1.4 and 1.6. In particular, the refractive index of the encapsulation, or of the material of the encapsulation, is less than the refractive index of the protective layer. The radiation of the semiconductor chip therefore passes first through the semiconductor layer sequence with a refractive index $n_D^\alpha$ of about 2.4, then through the protective layer with a refractive index of about 1.55 to 2.4, and following this through the encapsulation with a refractive index $n_D^\alpha$ of between 1.4 and 2.4, before it is externally output. In particular, the refractive index of the protective layer is adapted in such a way that a stepwise reduction of the refractive indices of the layers takes place in the emission direction of the radiation emitted by the semiconductor chip. In particular, no further layer is arranged between the semiconductor chip and the protective layer and/or between the protective layer and the encapsulation, so that the radiation passes only through the protective layer and the encapsulation before it is emitted outward.

According to at least one embodiment, the component comprises a protective layer, a current spreading layer and an encapsulation. According to this embodiment, the radiation of the semiconductor chip passes first through the semiconductor layer sequence with a refractive index $n_D^\alpha$ of about 2.4, then through a current spreading layer with a refractive index $n_D^\alpha$ of between 2.0 and 1.8, and then through the protective layer with a refractive index of about 1.55 to 1.75, and following this through the encapsulation with a refractive index $n_D^\alpha$ of between 1.4 and 2.4, such as between 1.4 and 1.6, before it is externally output. With this stepwise reduction of the refractive index in the emission direction of the radiation emitted by the semiconductor chip, the light output can be improved further. In order to achieve a refractive index of about 1.55 to 1.75 of the protective layer, the protective layer may include one or more first layers comprising an aluminum oxide and one or more second layer comprising a silicon oxide, or consists of these layers. In particular, no further layer is arranged between the semiconductor chip and the current spreading layer, between the current spreading layer and the protective layer and/or between the protective layer and the encapsulation, so that the radiation passes only through the current spreading layer, the protective layer and the encapsulation before it is emitted outward.

According to at least one embodiment, the refractive index $n_D^\alpha$ of the encapsulation is between 0.1 and 0.3 less than the refractive index $n_D^\alpha$ of the protective layer. This reduction has been found to be particularly advantageous in terms of the luminous efficiency. In a non-limiting embodiment, the refractive index $n_D^\alpha$ of the protective layer is furthermore between 0.1 and 0.3 less than the refractive index $n_D^\alpha$ of the current spreading layer.

According to at least one embodiment, the refractive index $n_D^\alpha$ of the encapsulation is between 0.1 and 0.3 less than the refractive index $n_D^\alpha$ of the protective layer, and the refractive index $n_D^\alpha$ of the protective layer is between 0.1 and 0.3 less than the refractive index $n_D^\alpha$ of the current spreading layer.

According to at least one embodiment, the encapsulation comprises or consists of: silicone or silsesquioxane. In particular, the encapsulation comprises a high-index silicone with a refractive index of more than 1.51, for example of 1.52. This has been found to be particularly advantageous for the light output.

As a high-index silicone with a refractive index of about 1.52, it is for example possible to use poly(dimethyl)siloxane in which at most 50 percent of the methyl groups may be replaced with phenyl groups.

Silsesquioxanes may have the formula $[RSiO_{3/2}]_n$ with R=H, alkyl, aryl or alkoxy. In a non-limiting embodiment, the alkyl radical is a methyl, ethyl or propyl radical and the alkoxy radical is a methoxy, ethoxy or propoxy radical. Silsesquioxanes have, for example, cage structures or polymeric structures with Si—O—Si bonds and with silicon atoms at the vertices of a tetrahedron. Silsesquioxanes may have a refractive index $n_D^\alpha$ of more than 1.55.

According to at least one embodiment, the semiconductor chip is arranged on a lead frame. The semiconductor chip is electrically contacted by means of the lead frame. This may, for example, be carried out by means of bond pads arranged on the current spreading layer. Lead frames age very rapidly, for example, by the effect of oxygen and/or moisture, which inter alia leads to a brown coloration. The lifetime of the optoelectronic component is thereby shortened, so that the market requirements for many applications cannot be satisfied. Furthermore, the reflective property of the lead frame is reduced by the aging phenomena, so that the luminous efficiency of the component decreases with an increasing operating time.

According to at least one embodiment, the lead frame may comprise copper, steel or a ceramic made of $Al_2O_3$ and/or AlN. The lead frame is, in particular, configured to be reflective for the radiation of the semiconductor chip.

According to at least one embodiment, the protective layer is arranged over the lead frame. In particular, the protective layer is arranged over a main surface, facing toward the semiconductor chip, of the lead frame. In a non-limiting embodiment, the part of the main surface of the lead frame, facing toward the semiconductor chip, over which the semiconductor chip is arranged is free from the protective layer. The main surface of the lead frame extends, in particular, parallel to the radiation exit surface of the semiconductor chip. Advantageously, according to this embodiment, the lead frame may be protected against premature aging phenomena and the resulting loss of reflectivity for the radiation emitted by the semiconductor chip. By the protected layer, the lead frame is protected in particular against oxidation, since oxygen and/or moisture penetrate only slightly or not at all through the protective layer to the lead frame. According to this embodiment, with the protective layer which is arranged over the lead frame and over the radiation exit surface of the semiconductor chip, both the luminous efficiency may be increased and the lead frame may be safeguarded from premature aging, so that the luminous efficiency may be kept constant, or almost constant, throughout the entire lifetime of the component.

According to at least one embodiment, the semiconductor chip is arranged in a recess of a package which comprises the lead frame. The recess in this case comprises, in particular, side walls which are configured to be reflective for the radiation emitted by the semiconductor chip. This may be carried out using the package material or a reflective coating of the side walls of the package.

The protective layer is arranged according to at least one embodiment over a surface, facing toward the semiconductor chip, of the recess of the package. In particular, the protective layer is arranged on the side walls of the recess of the package. In this way, it is also possible to safeguard the package from premature aging and to preserve its reflectivity for the radiation emitted by the semiconductor chip during the lifetime of the component.

According to at least one embodiment, the encapsulation is arranged over the protective layer and in the recess of the package.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the illumination apparatus. In the following description, various aspects are described with reference to the following drawings, in which.

Elements that are identical, of the same type or of the same effect can be provided with the same reference signs across all figures. The figures are not true to scale.

DETAILED DESCRIPTION

Figure 1:
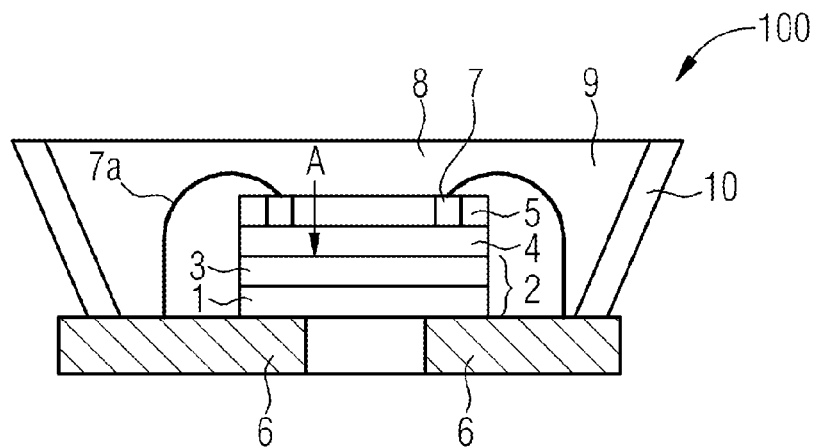
FIGS. 1 to 3 and 6 to 8 show schematic side views of an optoelectronic component.

The exemplary embodiment of an optoelectronic component 100 as represented in FIG. 1 comprises a semiconductor chip 2, which emits radiation during operation of the component. The semiconductor chip is based for example on a semiconductor layer sequence 3 based on gallium nitride, which has a refractive index of about 2.4. The semiconductor chip 2 furthermore comprises a substrate 1, for example made of sapphire. By means of the substrate 1, the semiconductor chip 2 is fastened on a lead frame 6 and electrically contacted by the lead frame 6 by means of bond pads 7 and bond wires 7a. The lead frame 6 comprises for example copper, and is reflective for the radiation of the semiconductor chip 2. The lead frame 6 is arranged in an optically opaque, for example prefabricated package 10 having a recess 8. Prefabricated is intended to mean that the package 10 is already formed on the lead frame 6, for example manufactured by means of injection molding, before the semiconductor chip 2 is mounted on the lead frame 6. The package comprises, for example, an optically opaque plastic. By means of the radiation exit surface A of the semiconductor chip 2, a current spreading layer 4 made of indium tin oxide is arranged in direct mechanical contact with the radiation exit surface A. Two bond pads 7, which are electrically contacted by the lead frame 6 by means of the bond wires 7a, are arranged on the current spreading layer 4. A protective layer 5 is arranged over the current spreading layer 4. The recess 8 of the package 10 is formed with an encapsulation 9, for example made of a high-index silicone with a refractive index of 1.52.

The protective layer 5 consists of from one to 50 second layers 5a consisting of $SiO_2$ and of from one to 50 first layers 5b consisting of $Al_2O_3$ (not shown). If the protective layer comprises a plurality of first and second layers, these may be arranged alternatingly. With the alternating arrangement, it is possible for a first layer 5a to be arranged over the current spreading layer 4 first and a second layer 5b to be arranged thereover, or for a second layer 5b to be arranged first and for a first layer 5a to be arranged thereover. The first layers 5a and the second layers 5b respectively have a layer thickness of between 20 nm inclusive and 120 nm inclusive.

As an alternative, the protective layer 5 may consist of from one to 50 second layers 5a consisting of $SiO_2$ and of from one to 50 third layers 5c consisting of $TiO_2$. If the protective layer 5 comprises a plurality of second and third layers, these may be arranged alternatingly.

As an alternative, the protective layer 5 may furthermore consist of from one to 50 second layers 5a consisting of $SiO_2$, of from one to 50 first layers 5b consisting of $Al_2O_3$ and of from one to 50 third layers 5c consisting of $TiO_2$. If the protective layer 5 comprises a plurality of first, second and third layers, these may be arranged alternatingly.

The protective layer 5 has a refractive index $n_D^\alpha$ of from 1.55 to 1.75. The radiation emitted by the semiconductor chip 2 is externally output through the semiconductor layer sequence 3 with a refractive index $n_D^\alpha$ of about 2.4, through the current spreading layer 4 with a refractive index $n_D^\alpha$ of about 1.9, the protective layer 5 with a refractive index $n_D^\alpha$ of from 1.55 to 1.75, and the encapsulation 9 with a refractive index $n_D^\alpha$ of about 1.52. With this stepwise reduction of the refractive indices of the layers through which the radiation passes, no or only low losses of the radiation occur by reflection, so that the luminous efficiency is particularly high. Furthermore, the semiconductor chip 2 is protected against moisture and oxygen by the protective layer 5, so that premature failure of the component 100 due to moisture is prevented.

The protective layer 5 of the component 100 of FIG. 1 may already be applied before dicing of the semiconductor chip. A wafer having the grown or applied semiconductor layer sequence may in this case initially be coated with the current spreading layer 4. Following this, the protective layer 5 is applied onto the current spreading layer 4, for example by means of atomic layer deposition (ALD) or chemical vapor deposition (CVD), such as at low temperatures. Only then is the wafer diced to form the individual semiconductor chips 2. By application of the protective layer 5 already before the dicing of the wafer to form the semiconductor chips 2, the production method is very efficient and not very time-intensive.

Figure 2:
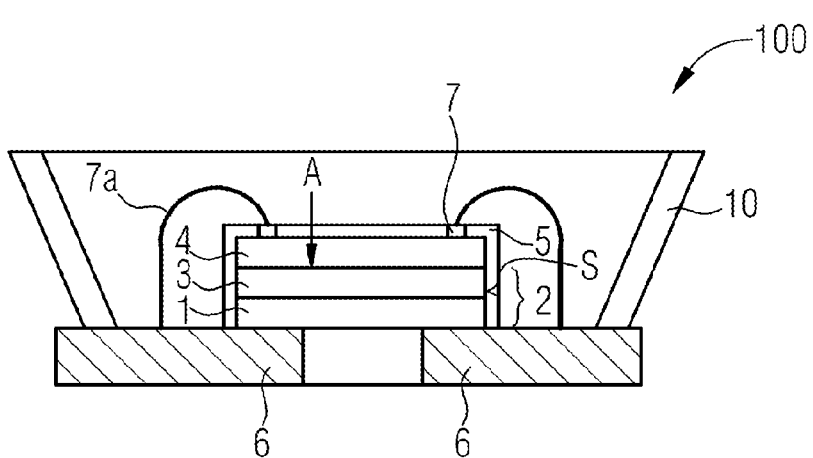

In the exemplary embodiment of an optoelectronic component 100 as represented in FIG. 2, in comparison with the component of FIG. 1, the protective layer 5 is additionally arranged over the side surfaces S of the semiconductor chip 2. In particular, as represented in FIG. 2, the protective layer 5 is also arranged over the side surfaces of the current spreading layer 4. Radiation which emerges through the side surfaces S from the semiconductor layer sequence 3 with a refractive index $n_D^\alpha$ of about 2.4 therefore initially passes through the protective layer 5 with a refractive index $n_D^\alpha$ of from 1.55 to 1.75, for example about 1.7, and subsequently through the encapsulation 9 with a refractive index $n_D^\alpha$ of about 1.52. With this stepwise reduction of the refractive indices of the layers, the luminous efficiency may also be improved in terms of the radiation emitted through the side surfaces S, and the semiconductor chip 2 may also be protected against moisture on the side surfaces S.

The application of the protective layer 5 of the component 100 of FIG. 2 is carried out after dicing the semiconductor chip 2 from a wafer. In particular, the bond pads 7 are initially applied onto the current spreading layer 4. The protective layer 5 may be applied onto the current spreading layer 4 and the bond pads 7, the bond pads 7 being for example freed again from the protective layer 5 by etching methods. As an alternative, the protective layer 5 may also be applied by means of a mask in order to keep the surface of the bond pads 7 free from the protective layer 5. This method is found to be more time-intensive than the method for producing the component 100 of FIG. 1. However, the component 100 according to the embodiment of FIG. 2 is distinguished by a further optimization of the luminous efficiency because of the coating of the side surfaces S of the semiconductor chip 2 with the protective layer 5.

Figure 3:
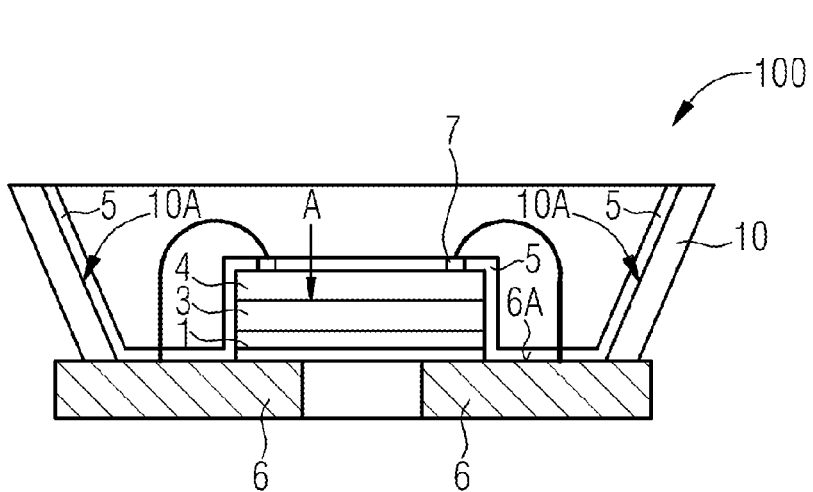

In the exemplary embodiment of an optoelectronic component 100 as represented in FIG. 3, in comparison with the optoelectronic component 100 of FIG. 2, the protective layer 5 is additionally arranged over a main surface 6A, facing toward the semiconductor chip 2, of the lead frame. In this case, the part of the main surface 6A of the lead frame, facing toward the semiconductor chip, over which the semiconductor chip 2 is arranged is free from the protective layer 5. The main surface 6A of the lead frame extends, in particular, parallel to the radiation exit surface A of the semiconductor chip 2. Furthermore, according to this embodiment the protective layer 5 is arranged over the side walls 10A of the recess of the package. The side walls 10A of the recess of the package are configured to be reflective for the radiation emitted by the semiconductor chip 2. To this end, the package material may be configured to be reflective or a reflective coating (not shown here) may be applied over the side walls 10A of the recess of the package. Thus, the lead frame 6 and also the package 10 may be protected against premature aging and the reflectivity of the latter for the radiation emitted by the semiconductor chip 2 may be preserved over the operating time of the component 100.

The protective layer 5 of the component 100 of FIG. 3 is carried out after the semiconductor chip 2 has been arranged in the recess 8 of the package 10. In particular, the bond pads 7 are initially applied onto the current spreading layer 4. The protective layer 5 may be applied onto the current spreading layer 4 and the bond pads 7, the bond pads 7 being for example freed again from the protective layer 5 by etching methods. As an alternative, the protective layer 5 may also be applied by means of a mask in order to keep the surface of the bond pads 7 free from the protective layer 5. The protective layer 5 is furthermore applied over the side walls 10A of the recess of the package.

Figure 4:
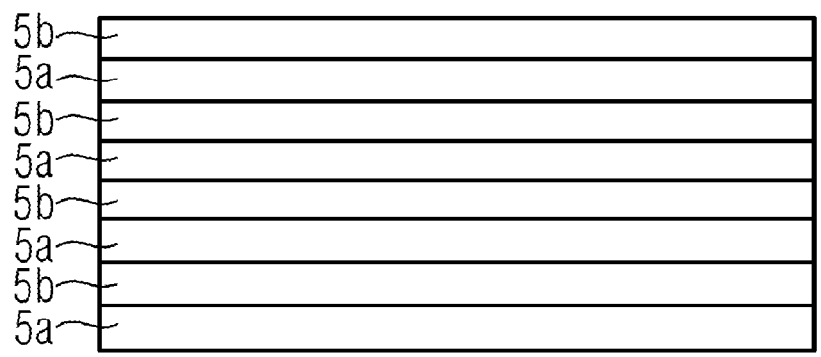
FIGS. 4 and 5 show schematic side views of a protective layer.

FIG. 4 shows a protective layer 5 such as may be formed in the components 100 of FIGS. 1 to 3. The protective layer 5 respectively comprises four first layers 5a and four second layers 5b, which are arranged alternatingly. The first layers 5a consist of $Al_2O_3$, and the second layers 5b consist of $SiO_2$. The first layers 5a and the second layers 5b respectively have a layer thickness of from 20 nm inclusive to 120 nm inclusive. In a non-limiting embodiment, the first layers 5a have a layer thickness of 40 nm and the second layers 5b have a layer thickness of 20 nm. The protective layer therefore has a refractive index of about 1.7. This has been found to be particularly efficient for the luminous efficiency, in particular with a current spreading layer of ITO with a refractive index of 1.9 and an encapsulation made of a silicone with a refractive index of 1.52. A second layer 5b, arranged over a first layer 5a, respectively covers the underlying first layer 5a fully, or surface-wide, and a first layer 5a arranged over a second layer 5b, respectively covers the underlying second layer 5b fully, or surface-wide. In a non-limiting embodiment, the protective layer 5 is arranged on the radiation exit surface A of a semiconductor chip 2 in such a way that the second layers 2b are respectively arranged over the first layers 2a. In other words, the protective layer 5 is arranged in such a way that the respective first layer 5a is arranged before the respective second layer 5b in the beam path of the radiation of the semiconductor chip 2. With this arrangement of the protective layer 5, a particularly high luminous efficiency may be achieved. As an alternative, the protective layer may also consist of a first layer 5a consisting of $Al_2O_3$ and a second layers 5b consisting of $SiO_2$ 5b. In a non-limiting embodiment, the first layer 5a has a layer thickness of 40 nm and the second layers 5b has a layer thickness of 20 nm. The protective layer therefore has a refractive index of about 1.7.

Figure 5:

FIG. 5 shows a protective layer 5 such as may be formed in the components 100 of FIGS. 1 to 3. The protective layer 5 respectively comprises two first layers 5a, two second layers 5b and two third layers 5c, which are arranged alternatingly. The first layers 5a consist of $Al_2O_3$, the second layers 5b consist of $SiO_2$, and the third layers 5c consist of $TiO_2$. The first layers 5a, the second layers 5b and the third layers 5c respectively have a layer thickness of from 20 nm inclusive to 120 nm inclusive, for example of 30 mm. In a non-limiting embodiment, the protective layer 5 is arranged on the radiation exit surface A of a semiconductor chip 2 in such a way that the third layers 2c are respectively arranged over the second layers 5b and the second layers 2b are respectively arranged over the first layers 2a.

Figure 6:
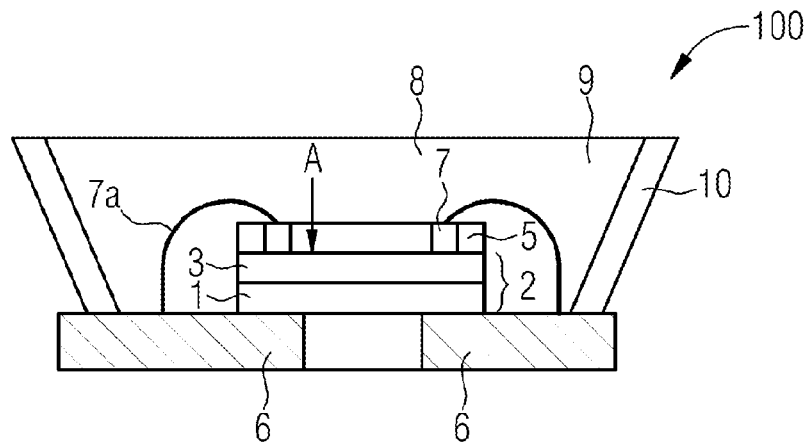
Figure 7:
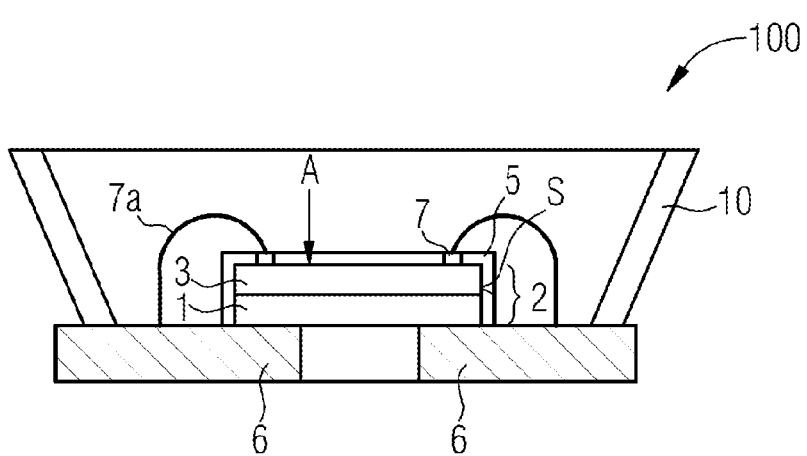
Figure 8:
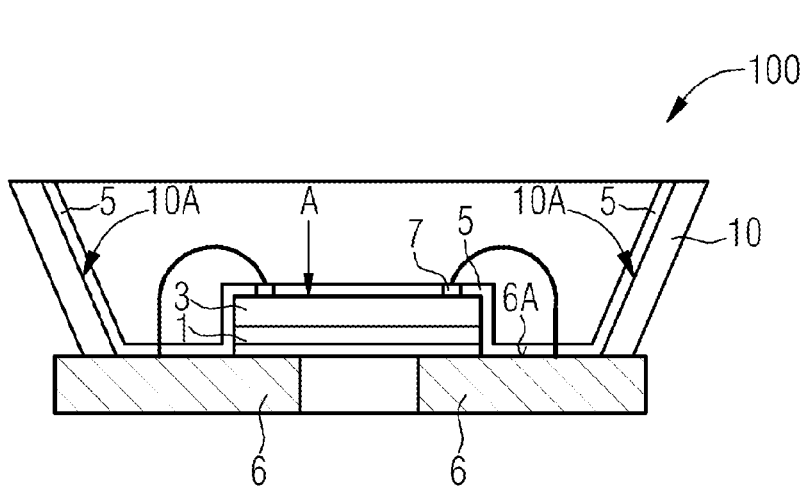

In comparison with the components 100 of FIGS. 1 to 3, the components 100 of FIGS. 6, 7 and 8 do not have a current spreading layer 4.

As an alternative to the protective layers described with reference to FIGS. 1 to 5, the protective layer 5 in the components of FIGS. 6, 7 and 8 may consist of from 1 to 50 first layers 5a consisting of $Al_2O_3$ and from 1 to 50 third layers 5c consisting of $TiO_2$, which are arranged alternatingly. The protective layer 5 therefore has a refractive index of between 1.8 and 2.4.

The invention described here is not restricted by the description with the aid of the exemplary embodiments; rather, the invention comprises any new feature and any combination of features, which includes in particular any combination of features in the patent claims, even if this feature or this combination per se is not explicitly indicated in the patent claims or exemplary embodiments.

The priority of German Patent Application DE 102017107957.2 is claimed, the disclosure content of which is included here by reference.

LIST OF REFERENCES 100 optoelectronic component
1 substrate
2 semiconductor chip
3 semiconductor layer sequence
4 current spreading layer
5 protective layer
5a first layer
5b second layer
5c third layer
6 lead frame
6A main surface, facing toward the semiconductor chip, of the lead frame
7 bond pad
7a bond wire
8 recess
9 encapsulation
10 package
10A sidewalls of the recess of the package
A radiation exit surface
S side surfaces of the semiconductor chip

The invention claimed is:
1. An optoelectronic component, comprising:
a semiconductor chip adapted to emit electromagnetic radiation, wherein the semiconductor chip comprises a radiation exit surface and a protective layer is arranged over the radiation exit surface, and wherein the protective layer comprises:
  at least two first layers comprising an aluminum oxide and at least two second layers comprising a silicon oxide;
  at least two first layers comprising an aluminum oxide and at least two third layers comprising a titanium oxide; or
  at least two second layers comprising a silicon oxide and at least two third layers comprising a titanium oxide;
  and wherein the at least two first layers and the at least two second layers, the at least two first layers and the at least two third layers, or the at least two second layers and the at least two third layers are arranged alternatingly; and
  a current spreading layer comprising one or more transparent conductive oxides arranged between the radiation exit surface and the protective layer.

2. The optoelectronic component according to claim 1, wherein the protective layer has a refractive index $n_D^\alpha$ ranging from 1.55 to 2.4.

3. The optoelectronic component according to claim 1, wherein at least one second layer of the at least two second layers is arranged over at least one first layer of the at least two first layers.

4. The optoelectronic component according to claim 1, wherein at least one first layer of the at least two first layers, at least one second layer of the at least two second layers, and at least one third layer of the at least two third layers respectively have a layer thickness ranging from 20 nm inclusive to 120 nm inclusive.

5. The optoelectronic component according to claim 1, wherein at least one second layer of the at least two second layers comprises $SiO_2$ or consists of $SiO_2$, at least one first layer of the at least two first layers comprises $Al_2O_3$ or consists of $Al_2O_3$, at least one third layer of the at least two third layers comprises $TiO_2$ or consists of $TiO_2$, or combinations thereof.

6. The optoelectronic component according to claim 1, wherein the protective layer is arranged over the side surfaces (S) of the semiconductor chip.

7. The optoelectronic component according to claim 1, wherein the refractive index $n_D^\alpha$ of the protective layer ranges from 0.1 to 0.3 less than the refractive index $n_D^\alpha$ of current spreading layer.

8. The optoelectronic component according to claim 1, wherein the semiconductor chip is arranged on a lead frame, and the protective layer is arranged over a main surface, facing toward the semiconductor chip, of the lead frame.

9. The optoelectronic component according to claim 8, wherein the semiconductor chip is arranged in a recess of a package which comprises the lead frame, and the recess comprises side walls configured to be reflective for the radiation emitted by the semiconductor chip, and wherein the protective layer is arranged on the side walls of the recess of the package.

10. The optoelectronic component according to claim 1, further comprising an encapsulation arranged over the protective layer, and wherein the refractive index $n_D^\alpha$ of the encapsulation ranges from 0.1 to 0.3 less than the refractive index $n_D^\alpha$ of the protective layer.

11. The optoelectronic component according to claim 10, wherein the encapsulation is arranged over the protective layer and in the recess of the package.

12. The optoelectronic component according to claim 1, wherein the refractive index of at least one first layer of the at least two first layers, at least one second layer of the at least two second layers, and the at least one third layer of the at least two third layers which are arranged on the semiconductor chip decreases stepwise.

13. An optoelectronic component, comprising:
  a semiconductor chip adapted to emit electromagnetic radiation, wherein the semiconductor chip comprises:
    a radiation exit surface;
    a protective layer arranged over the radiation exit surface, and wherein the protective layer comprises:
      at least two first layers,
      at least two second layers,
      at least two third layers comprising a titanium oxide;
      wherein the at least two first layers, the at least two second layers,
      and the at least two third layers are arranged alternatingly; and
    a current spreading layer comprising one or more transparent conductive oxides arranged between the radiation exit surface and the protective layer.

14. The optoelectronic component according to claim 13, wherein the protective layer has a refractive index $n_D^\alpha$ ranging from 1.55 to 2.4.

15. The optoelectronic component according to claim 13, wherein at least one second layer of the at least two second layers is arranged over at least one first layer of the at least two first layers.

16. The optoelectronic component according to claim 13, wherein at least one first layer of the at least two first layers, at least one second layer of the at least two second layers, and at least one third layer of the at least two third layers respectively have a layer thickness ranging from 20 nm inclusive to 120 nm inclusive.

17. The optoelectronic component according to claim 13, wherein at least one second layer of the at least two second layers comprises $SiO_2$ or consists of $SiO_2$, at least one first layer of the at least two first layers comprises $Al_2O_3$ or consists of $Al_2O_3$, at least one third layer of the at least two third layers comprises $TiO_2$ or consists of $TiO_2$, or combinations thereof.

18. The optoelectronic component according to claim 13, wherein the protective layer is arranged over the side surfaces (S) of the semiconductor chip.

19. The optoelectronic component according to claim 13, wherein the refractive index $n_D^\alpha$ of the protective layer ranges from 0.1 to 0.3 less than the refractive index $n_D^\alpha$ of current spreading layer.

20. The optoelectronic component according to claim 13, wherein the semiconductor chip is arranged on a lead frame, and the protective layer is arranged over a main surface, facing toward the semiconductor chip, of the lead frame.

* * * * *